(12) United States Patent
Jakob et al.

(10) Patent No.: US 12,027,295 B2
(45) Date of Patent: Jul. 2, 2024

(54) HOUSING FOR FERRITE BEADS AND OTHER PASS-THROUGH ELECTRICAL FILTER COMPONENTS

(71) Applicant: Power Integrations, Inc., San Jose, CA (US)

(72) Inventors: Andreas Jakob, Münchenbuchsee (CH); Olivier Garcia, Brügg (CH); Simon Baumgartner, Biel/Bienne (CH); Peter Kroll, Worb (DE); Dany Yazbeck, Bettlach (CH)

(73) Assignee: POWER INTEGRATIONS, INC., San Jose, CA (US)

( * ) Notice: Subject to any disclaimer, the term of this patent is extended or adjusted under 35 U.S.C. 154(b) by 592 days.

(21) Appl. No.: 16/951,897

(22) Filed: Nov. 18, 2020

(65) Prior Publication Data

US 2021/0074463 A1    Mar. 11, 2021

Related U.S. Application Data

(63) Continuation of application No. PCT/US2019/034621, filed on May 30, 2019.

(60) Provisional application No. 62/678,842, filed on May 31, 2018.

(51) Int. Cl.
| | |
|---|---|
| H01F 27/06 | (2006.01) |
| H01F 17/06 | (2006.01) |
| H01F 27/29 | (2006.01) |
| H05K 3/30 | (2006.01) |

(52) U.S. Cl.
CPC ........... *H01F 17/062* (2013.01); *H01F 27/06* (2013.01); *H01F 27/292* (2013.01); *H05K 3/301* (2013.01); *H01F 2017/065* (2013.01); *H01F 2027/065* (2013.01)

(58) Field of Classification Search
CPC ...... H01F 17/062; H01F 27/06; H01F 27/292; H01F 2017/065; H01F 2027/065
USPC ........................................................ 336/229
See application file for complete search history.

(56) References Cited

U.S. PATENT DOCUMENTS

| | | | |
|---|---|---|---|
| 4,821,152 | A | 4/1989 | Lorenzen |
| 6,268,787 | B1 | 7/2001 | Onizuka |
| 7,170,381 | B2 | 1/2007 | Polivka et al. |
| 8,102,237 | B2 | 1/2012 | Espino |

(Continued)

FOREIGN PATENT DOCUMENTS

| | | |
|---|---|---|
| CN | 201435474 Y | 3/2010 |
| CN | 201440480 U | 4/2010 |

(Continued)

OTHER PUBLICATIONS

International Application No. PCT/US2019/034621, International Search Report and Written Opinion of the International Searching Authority, Sep. 16, 2019, 20 pages.

(Continued)

*Primary Examiner* — Shawki S Ismail
*Assistant Examiner* — Joselito S. Baisa
(74) *Attorney, Agent, or Firm* — Karina Martha G. Li

(57) ABSTRACT

A system for mounting a filter component to a circuit board. The system comprises a filter component housing dimensioned to house a filter component. The system further comprises a mount between the filter component housing and the circuit board, the mount configured to couple the filter component housing to the circuit board.

24 Claims, 14 Drawing Sheets

(56) References Cited

U.S. PATENT DOCUMENTS

| | | | |
|---|---|---|---|
| 8,378,770 B2* | 2/2013 | Chen | H01F 27/29 |
| | | | 336/208 |
| 8,614,615 B2 | 12/2013 | Cuadra et al. | |
| 8,618,903 B2* | 12/2013 | Fornasari | H01F 27/24 |
| | | | 336/229 |
| 8,766,756 B2 | 7/2014 | Hester et al. | |
| 8,854,167 B2* | 10/2014 | Lin | H05K 5/0095 |
| | | | 336/200 |
| 9,148,959 B2 | 9/2015 | Quek | |
| 9,177,714 B2 | 11/2015 | Espino | |
| 9,722,499 B2 | 8/2017 | Martin | |
| 9,773,608 B2 | 9/2017 | Rätz et al. | |
| 2003/0024734 A1* | 2/2003 | Ineson | H01F 27/292 |
| | | | 174/260 |
| 2004/0173369 A1* | 9/2004 | Cherniski | H05K 9/0066 |
| | | | 174/36 |
| 2005/0231861 A1* | 10/2005 | Power | H01H 83/144 |
| | | | 361/42 |
| 2006/0073737 A1 | 4/2006 | Lorenzen | |
| 2008/0100400 A1* | 5/2008 | Lucas | H05K 9/0066 |
| | | | 333/185 |
| 2011/0205765 A1 | 8/2011 | Saito et al. | |
| 2014/0197914 A1* | 7/2014 | Go Chua | H05K 1/145 |
| | | | 29/832 |
| 2016/0065164 A1* | 3/2016 | Meier | H01F 27/02 |
| | | | 336/229 |
| 2020/0357571 A1 | 11/2020 | Hwang | |

FOREIGN PATENT DOCUMENTS

| | | | | |
|---|---|---|---|---|
| CN | 102714386 A | | 10/2012 | |
| DE | 3445614 C2 * | | 2/1996 | H01B 17/58 |
| DE | 102006026364 A1 | | 8/2007 | |
| DE | 112016002174 T5 * | | 1/2018 | H01F 17/062 |
| EP | 2549496 A2 * | | 1/2013 | H01F 17/062 |
| EP | 3179574 A1 | | 6/2017 | |
| GB | 2151417 A * | | 7/1985 | H01B 17/58 |
| JP | S639779 U | | 1/1988 | |
| JP | H0434012 U | | 3/1992 | |
| JP | H0548308 U | | 6/1993 | |
| JP | H05145268 A | | 6/1993 | |
| JP | H0679115 U | | 11/1994 | |
| JP | 3658482 B2 * | | 6/2005 | H02M 7/003 |
| JP | 2012156349 A | | 8/2012 | |
| JP | 2013165205 A | | 8/2013 | |
| JP | 2017118491 A | | 6/2017 | |
| KR | 20170069712 A * | | 6/2017 | |
| WO | WO-2004003942 A1 * | | 1/2004 | H01R 13/65912 |
| WO | 2011056979 A2 | | 5/2011 | |
| WO | WO-2016181835 A1 * | | 11/2016 | H01F 17/062 |

OTHER PUBLICATIONS

Chinese Application No. 2019800362944; Machine Translation of Chinese Office Action and Search Report; mailed May 18, 2022; 12 pages.
European Application Serial No. 19731846.2; Communication pursuant to Article 94(3) EPC; mailed Apr. 14, 2022; 11 pages.
European Application Serial No. 19731846.2, Communication pursuant to Article 94(3) EPC; mailed Jun. 7, 2023; 12 pages.
Japanese Application No. 2020-566228; "Search Report" Mar. 31, 2023; 16 pages.
Japanese Application No. 2020-566228; Machine Translation of Japanese Search Report; Mar. 31, 2023; 19 pages.
Japanese Application No. 2020-566228; Machine Translation of Notification of Reasons for Refusal; Mar. 31, 2023; 4 pages.
Japanese Application No. 2020-566228; Notification of Reasons for Refusal; Mar. 31, 2023; 4 pages.
Japanese Application No. 2020-566228, "Decision to Grant a Patent mailed Dec. 4, 2023 with Machine Translation"; Dec. 4, 2023, 4 pages.
Korean Application Serial No. 10-2022-7034345, "Notice of Non-Final Rejection with Machine Translation", Mailed Mar. 14, 2024; 18 pages.

* cited by examiner

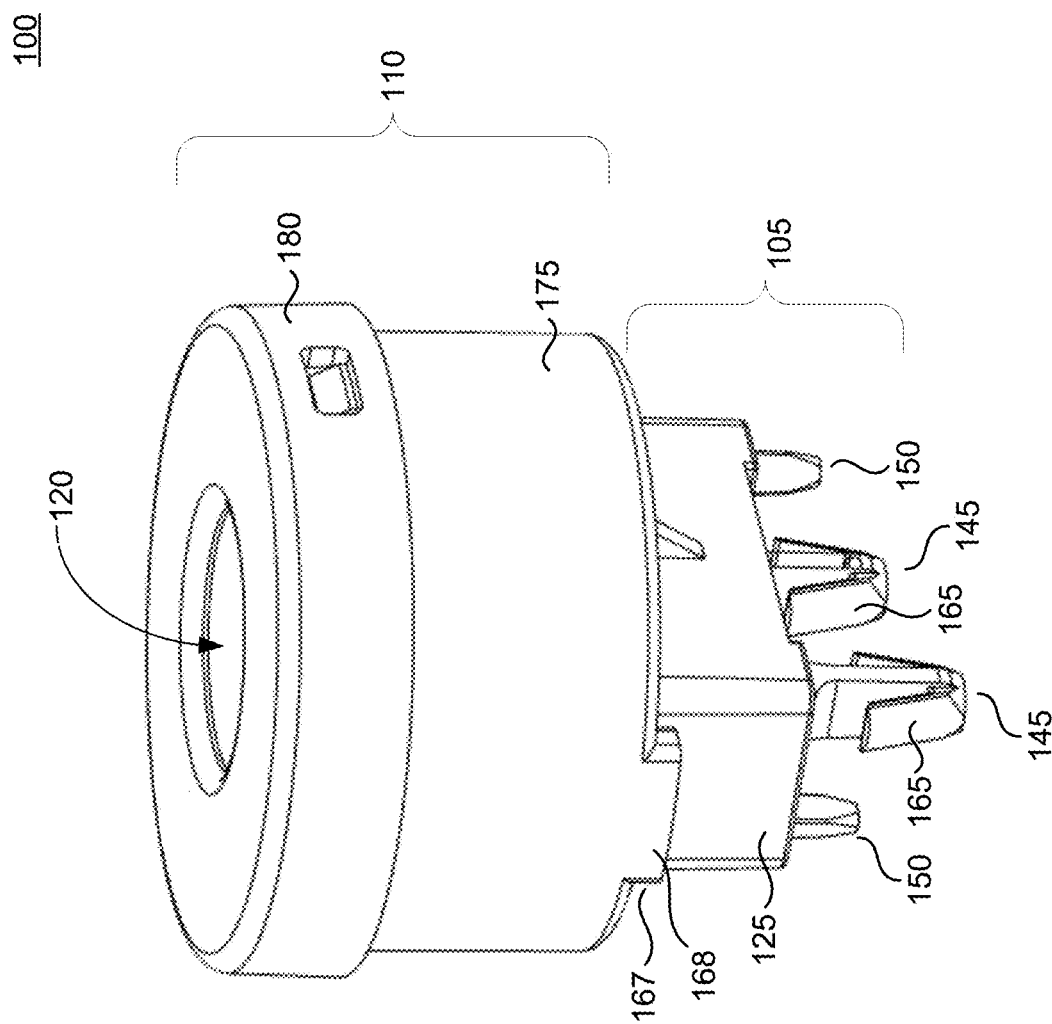

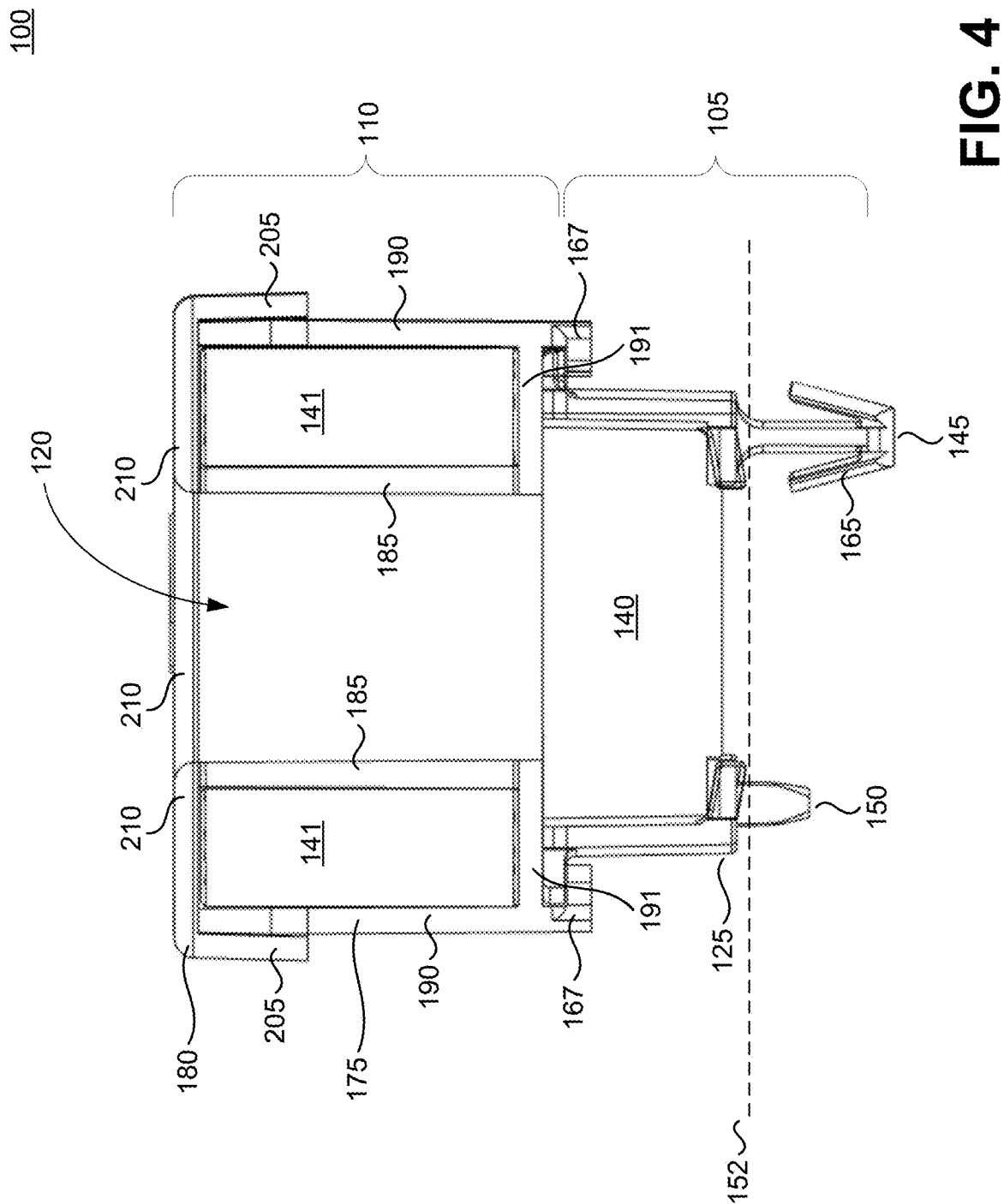

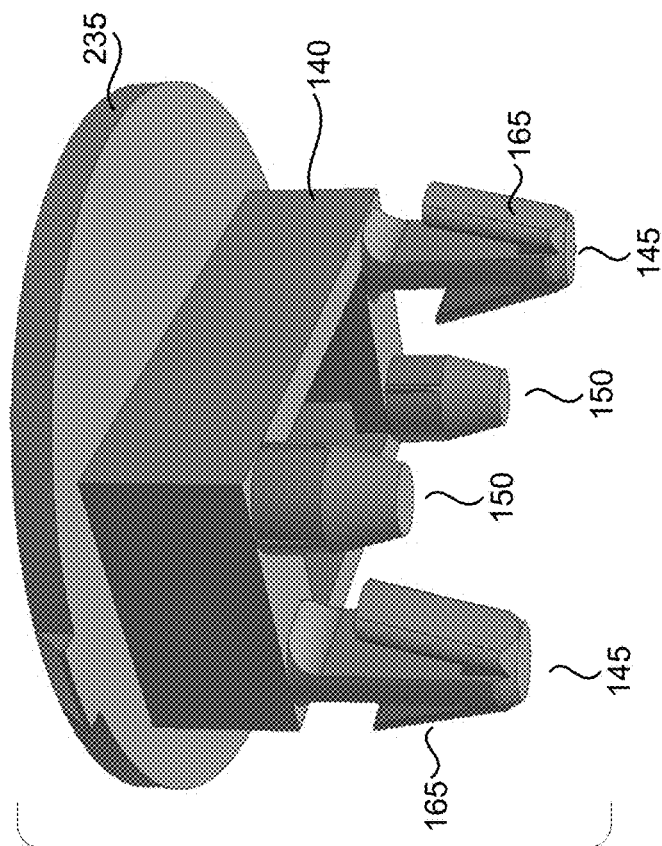
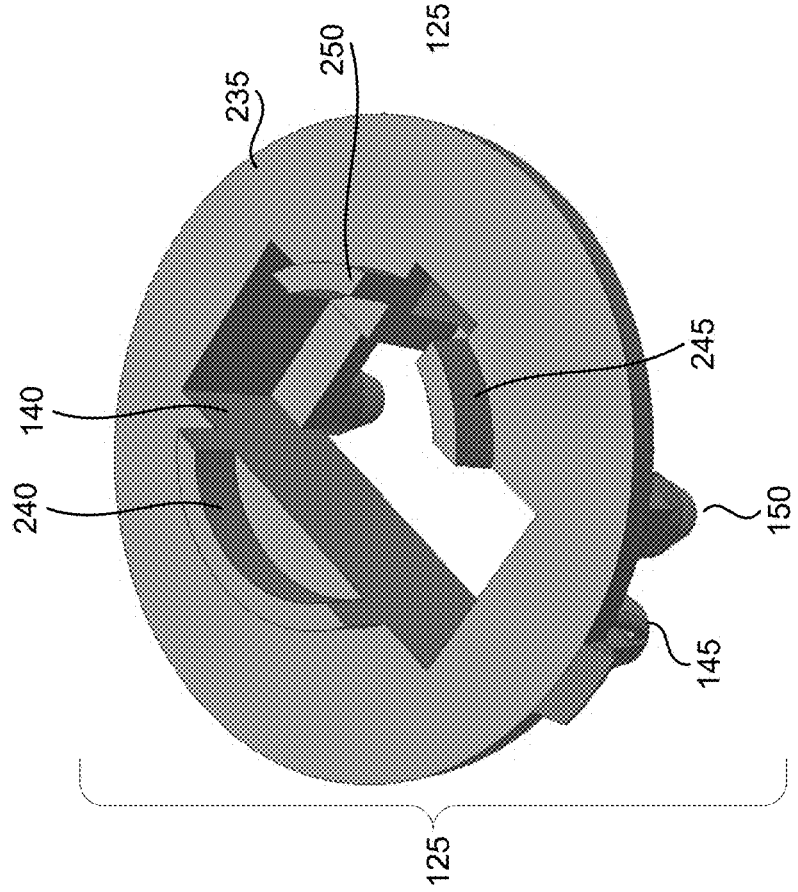
FIG. 7A
FIG. 7B

HOUSING FOR FERRITE BEADS AND OTHER PASS-THROUGH ELECTRICAL FILTER COMPONENTS

This application is a continuation application of International Patent Application No. PCT/US19/34621, filed on May 30, 2019, currently pending, which claims the benefit of U.S. Provisional Application No. 62/678,842, filed on May 31, 2018. International Patent Application No. PCT/US19/34621 and U.S. Provisional Application No. 62/678,842 are incorporated herein by reference in their entirety.

BACKGROUND

1. Field of the Invention

This disclosure relates to a housing for a ferrite beads. For example, the housing can be designed for mounting on a printed or other circuit board.

2. Discussion of the Related Art

A ferrite bead (also known as a ferrite blocks, core, ring, EMI filter, or choke) is a passive electric component that can suppress high frequency noise, for example, noise ranging from 100's of kHz to ten or more MHz, and common mode currents. Ferrite beads can concentrate the magnetic field associated with current flow and increase inductance to impede or filter noise. Ferrite beads can also produce resistive losses within the ferrite itself. The result is an impedance over a relatively broad frequency range that reduces or eliminates noise over that frequency range.

SUMMARY

The present application is directed to a housing for a ferrite bead or other filter component. The housing is designed to be mechanically coupled to an electric circuit board, such as a printed circuit board—either by a direct connection or indirectly by one or more intervening elements. The housing can be coupled to the board in conjunction with a wire-to-board connector. For example, the wire-to-board connector can be connected to the printed circuit board and the ferrite bead housing can be connected to the wire-to-board connector. As another example, the ferrite bead housing can be connected to the printed circuit board in the vicinity of the wire-to-board connector. In any case, a relatively robust mechanical coupling can be established between the ferrite bead and the board.

Such a relatively robust mechanical coupling can be beneficial in a number of applications where the printed circuit board is part of a moveable component or if a component that is vibrated, jolted, or otherwise mechanically disturbed. For example, printed circuit boards may be mounted in moving vehicles (e.g., automobiles, trams), in power generation apparatus on or near moveable parts (e.g., windmills, generators), on construction equipment (e.g., cranes), in industrial applications, or the like. By forming a relatively robust coupling, the relative positioning of the ferrite bead, the board, and wires or other electrical conductors remains more consistent. Further, forces associated with movement of the ferrite bead and the board are borne by the coupling between the ferrite bead and the board rather than, e.g., any electrical conductor that passes through the bead.

For example, a device can include a circuit board, a filter component, a filter component housing configured to house the filter component, wherein the filter component housing is coupled to the circuit board, and a wire electrically connected to the circuit board and passing through the filter component.

As another example, a system for mounting a filter component to a circuit board can include a filter component housing dimensioned to house a filter component, and a mount positionable between the filter component housing and the circuit board to couple the filter component housing to the circuit board.

As yet another example, a mount can be configured to couple a filter component to a circuit board. The mount can define a receptacle dimensioned to receive an electrical connection for connecting a wire to the circuit board. Reception of the electrical connection in the mount aligns one or more wires electrically connected to the circuit board by the connector with the filter component housed in the filter component housing.

The details of one or more implementations are set forth in the accompanying drawings and the description below. Other features, objects, and advantages will be apparent from the description and drawings, and from the claims.

BRIEF DESCRIPTION OF DRAWINGS

Non-limiting and non-exhaustive embodiments of the present invention are described with reference to the following figures, wherein like reference numerals refer to like parts throughout the various views unless otherwise specified.

The FIGS. are schematic representations of an assembly for mounting a filter component, such as a ferrite, to a printed or other circuit board, and an example mounting of assemblies on a circuit board.

Like reference symbols in the various drawings indicate like elements.

FIG. 1 is a perspective view of an assembly to hold a ferrite or other filter component FIG. 2A is an exploded view of the assembly of FIG. 1.

FIG. 2B is an exploded view of the assembly of FIG. 1, including a wire or cable FIG. 3A is a perspective view of the housing of the assembly to hold a filter component of FIG. 1.

FIG. 3B is a perspective view of the bottom of the housing of FIG. 1, illustrating a zoomed in view of the aligning mechanism.

FIG. 4 is a cross-section view of the assembly of FIG. 1.

FIG. 5 is a perspective view of the housing and base of FIG. 1, illustrating the bottom of the housing and the top of the base and their respective aligning mechanisms.

FIG. 6A is an exploded view of an electrical connector assembly including the base of the assembly to hold a filter component and a wire-to-board connector.

FIG. 6B is a top view of the electrical connector assembly of FIG. 6A with the base surrounding the wire-to-board connector.

FIG. 7A is a top perspective view of an alternate base for the assembly to hold a filter component.

FIG. 7B is a bottom perspective view of the alternate base for the assembly to hold a filter component of FIG. 7B.

FIGS. 8A is a perspective view of assemblies to hold filter components mounted onto a circuit board.

FIG. 8B is a top view of assemblies to hold filter components mounted onto a circuit board of FIG. 8A.

Figure 8A:
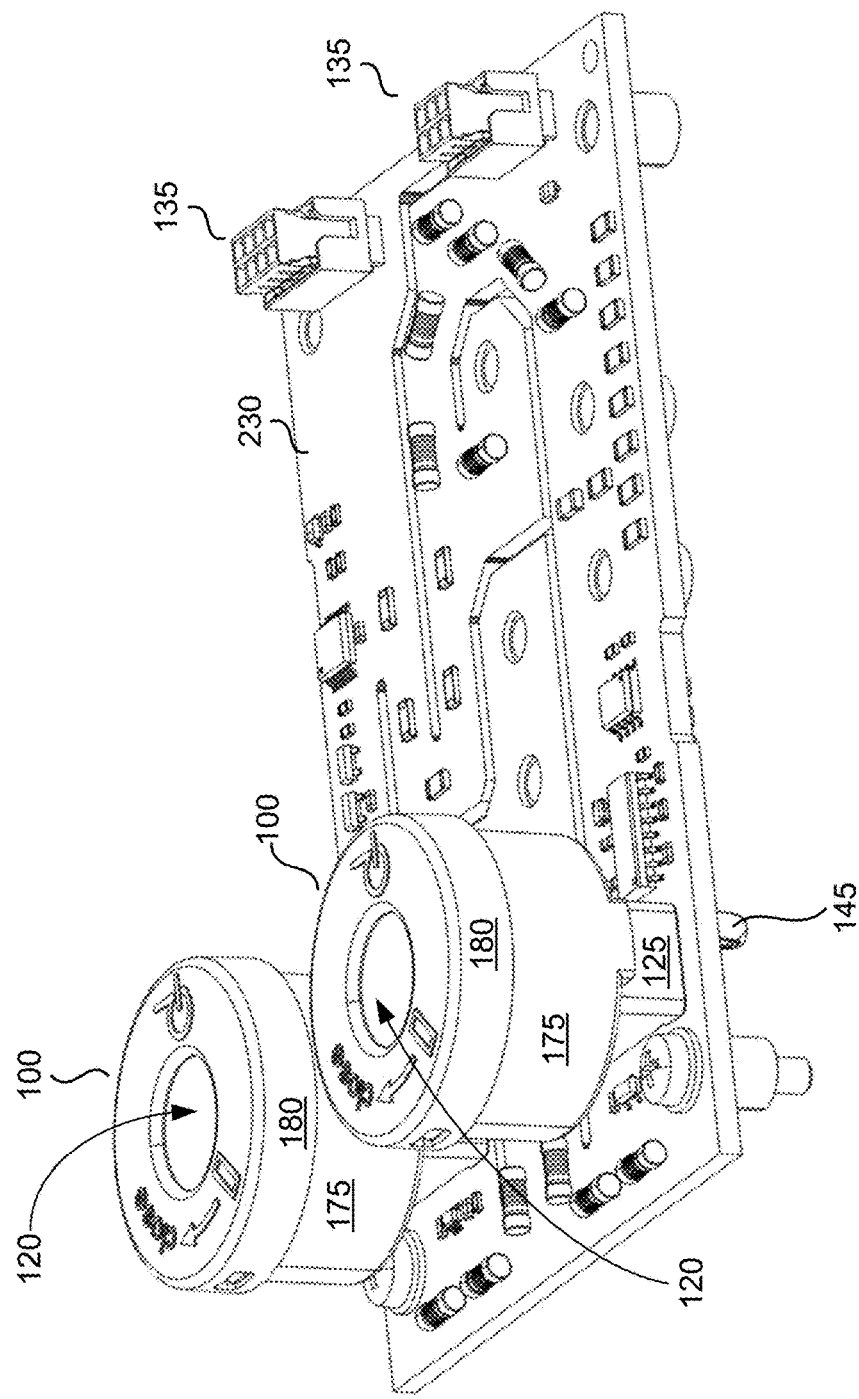
Figure 8B:
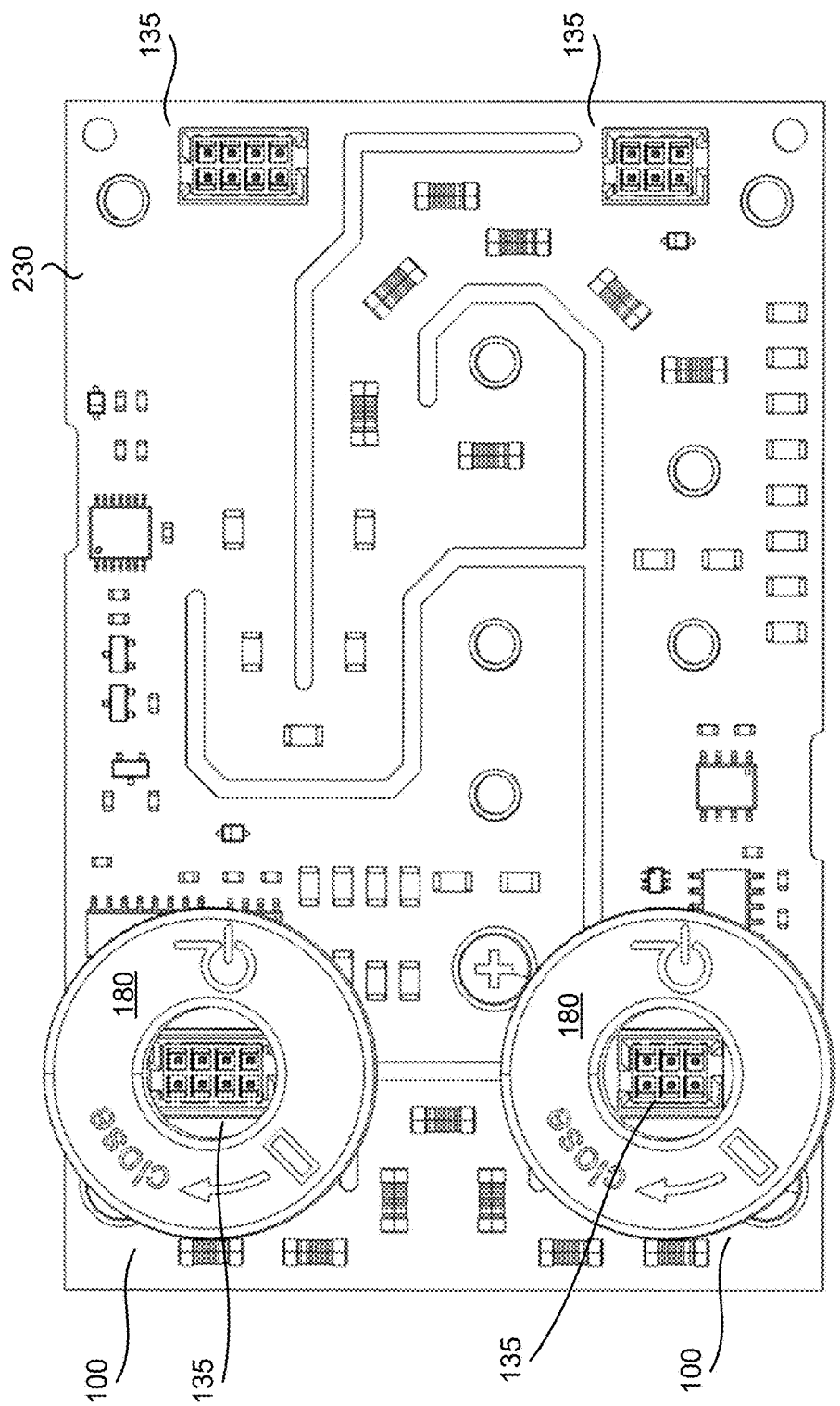
Figure 8C:
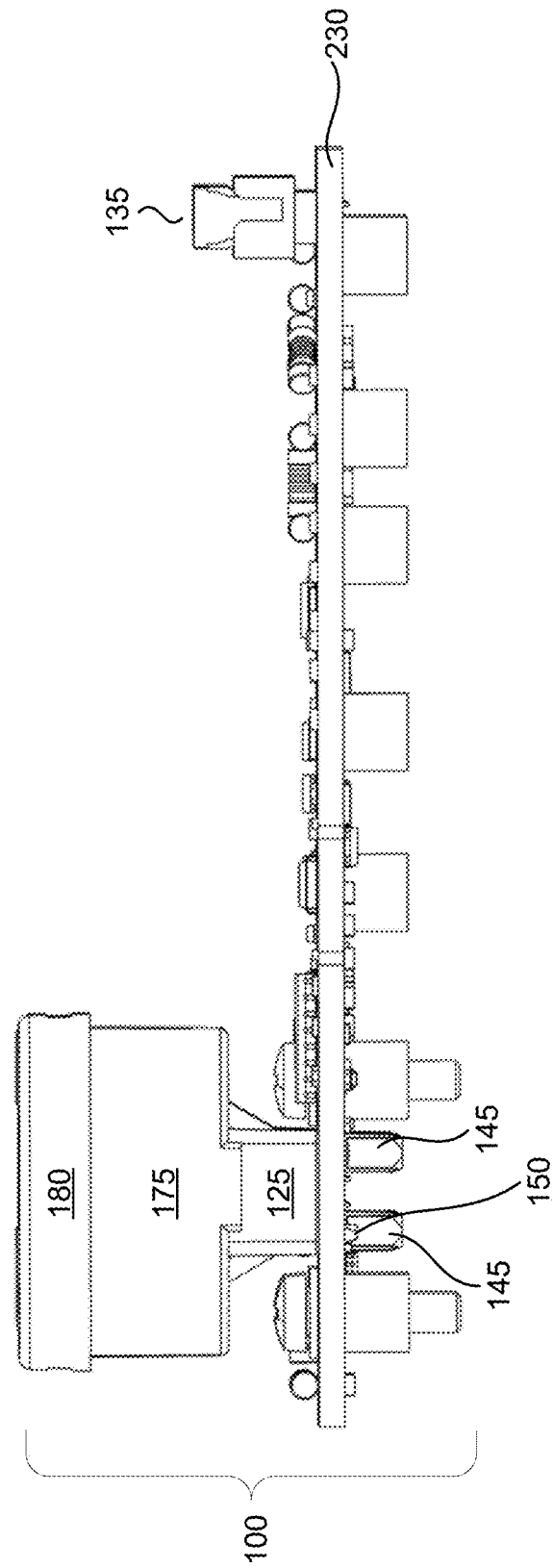

FIG. 8C is a side view of one of the assemblies to hold a filter component mounted onto a circuit board of FIG. 8A.

Figure 8D:
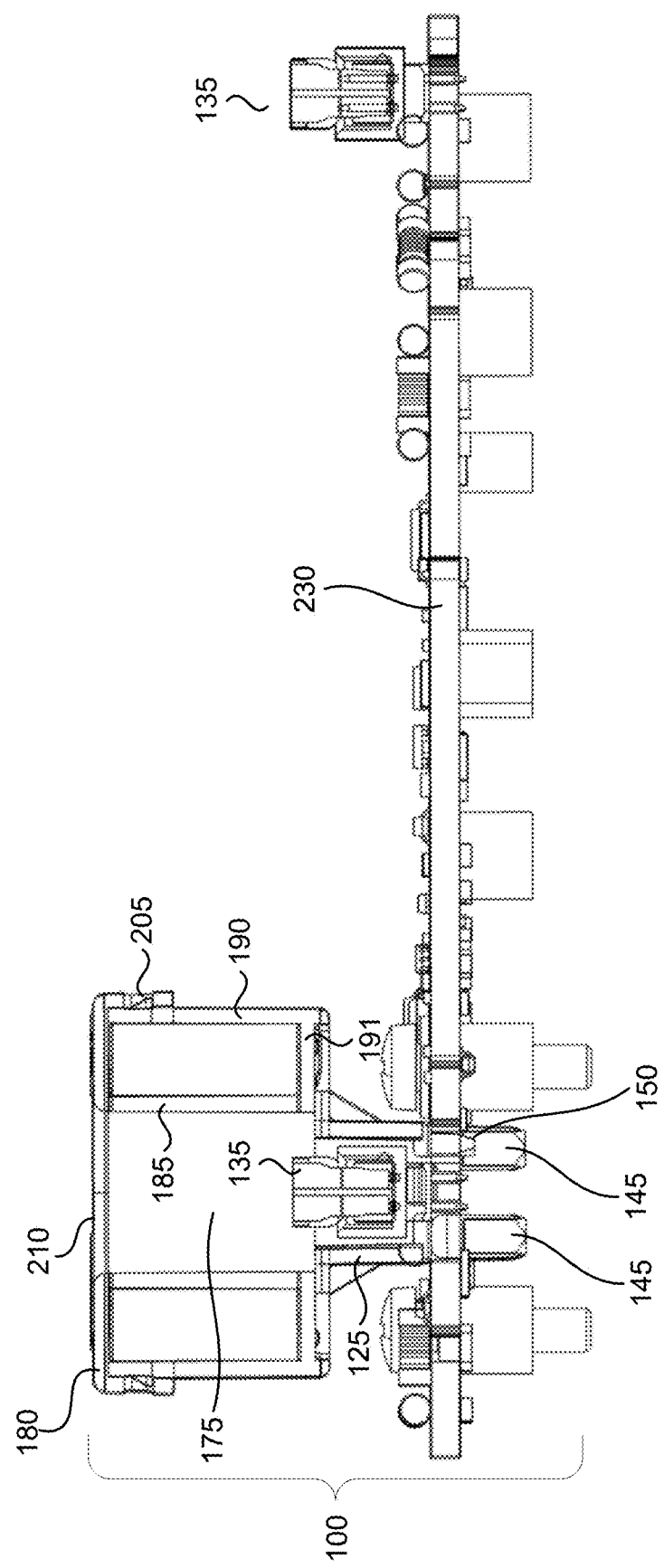

FIG. 8D is a cross-section view of one of the assemblies to hold a filter component mounted onto a circuit board of FIG. 8A.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As mentioned above, ferrite beads are a passive electric component that can suppress high frequency noise. Ferrite beads can be implemented in a variety of different form factors. For example, ferrite beads can be fixed onto conductors or around the pins of circuit-board components, such as transistors, connectors and integrated circuits. Ferrite beads can also be implemented as "snap-on" or "clamp-on" cores that clamp a wire (and its insulation). In general, a ferrite bead is slipped onto a wire which is coupled to a circuit board via a connector. However, in applications where the circuit board is part of a moveable component that is vibrated, jolted, or otherwise mechanically disturbed, the movement can dislodge the ferrite bead. In some cases, the dislodging of the ferrite bead can cause vibration test failures or damage the connection between the wire and the board or even the wire itself The present application is directed to, e.g., housing a ferrite bead or other pass-through filter component (such as a transformer) and coupling a housed pass-through filter component to a circuit board. For example, a housing can be designed to be mechanically coupled to a circuit board, such as a printed circuit board—either by a direct connection or indirectly by one or more intervening elements. The housing can be coupled to the board within the vicinity of a wire-to-board connector. For example, the pass-through filter component housing can be connected to the printed circuit board in the vicinity of the wire-to-board connector. In any case, a relatively robust mechanical coupling can be established between the pass-through filter component and the board.

As discussed above, relatively robust mechanical couplings can be beneficial in a number of applications where the printed circuit board is part of a moveable component or if a component is vibrated, jolted, or otherwise mechanically disturbed. For example, a printed circuit board can implement an IGBT gate driver. Further, IGBT gate drivers can be electrically coupled (e.g., in parallel or in series) together in moving vehicles, in power generation, transportation or consumption apparatus, on construction equipment, or the like. Wires that extend from one printed circuit board to another printed circuit board can implement such electrical couplings.

These and other wires that electrically connect to IGBT gate driver circuit boards can benefit from filter component housings. IGBT gate drivers are quite prone to noise issues and common mode current. Ferrite beads and other filter components can be used to reduce common mode noise and increase signal immunity. However, if a filter component is simply slid onto a wire that is electrically connected to an IGBT gate driver circuit boards, the wire may be subject to unduly high forces when mechanically disturbed.

The FIGS. are schematic representations of an assembly 100 for mounting a ferrite bead or other filter component to a printed or other circuit board, and an example mounting of one or more assemblies 100 on a circuit board. Each assembly 100 includes an electrical connector assembly 105 and a housing 110 for a ferrite bead or other filter component. Electrical connector assembly 105 forms a wire-to-board connection that fastens a wire to a circuit board 230 shown in FIGS. 8A, 8B, 8C and 8D. Housing 110 is an assembly that is dimensioned to a house a ferrite bead or other filter component 115. Housing 110 defines an opening 120 through which one or more wires can pass to reach electrical connector assembly 105. Electrical connector assembly 105 and housing 110 can be coupled to a circuit board 230 to form a relatively robust coupling that provides consistent mechanical and electrical properties even if the circuit board 230 and assembly 100 are moved.

For the sake of convenience, the text will hereafter refer to housing 110 as a "ferrite bead housing 110" and to filter component 115 as "ferrite bead 115." It is however to be understood that housing 110 can in some case house a filter component other than a ferrite bead.

FIG. 1 illustrates a perspective view of an assembly 100 including electrical connector assembly 105 and housing 110. For the assembly 100 shown in FIG. 1, the housing 110 is mounted onto the electrical connector assembly 105. In the illustrated implementations, electrical connector assembly 105 includes wire-to-board connector 135 and a mount 125. Although the wire-to-board connector 135 is not shown in FIG. 1, wire-to-board connector 135 is illustrated in FIGS. 6A, 6B, 8A, 8B, 8C and 8D. Wire-to-board connector 135 can be any of a number of different connectors that are suited for forming one or more electrical connections between conductor(s) of the circuit board and wire(s) that extend off the board. Wire-to-board connector 135 can use any of a variety of different technologies including, e.g., pin-and-socket, blade/contact, solder, or the like to form the electrical connection(s). Electrical terminals of the wire-to-board connector 135 can connect to the conductor(s) of the circuit board in either a thru-board or surface-mount arrangement.

Mount 125 is a mechanical member that is configured to provide a relatively robust mechanical coupling between the ferrite bead housing 110 and the circuit board in the vicinity of wire-to-board connector 135. Mount 125 is generally made from a mechanically stable, non-conductive material. Mount 125 acts an intermediary member between the ferrite bead housing 110 and the circuit board 230 in the vicinity of wire-to-board connector 135. In general, mount 125 surrounds wire-to-board connector 135 and is connected to the circuit board at multiple locations radially distributed around wire-to-board connector 135.

In the illustrated implementation, mount 125 includes a receptacle 140, a number of through-board protrusions 145, 150, and a number of mounting flanges 155, 160. It should be appreciated that receptacle 140 is not explicitly shown in FIG. 1, but is shown in FIGS. 4, 5, 6A, 6B, 7A and 7C. Similarly, mounting flanges 155, 160 are not explicitly shown in FIG. 1, but are shown in FIGS. 2, 5, 6A, and 6B. Receptacle 140 defines a volume or space that is dimensioned to receive at least a portion of wire-to-board connector 135. As will be later illustrated and discussed, receptacle 140 is generally in the center of mount 125. Protrusions 145, 150 and mounting flanges 155, 160 are arranged generally symmetrically and radially around receptacle 140. However, this is not necessarily the case and protrusions 145, 150 and mounting flanges 155, 160 can also be arranged asymmetrically around receptacle 140. Indeed, asymmetrical arrangements may be preferred in applications where the directionality of likely mechanical disturbances is known.

Through-board protrusions 145, 150 extend vertically from the board-facing surface of mount 125 and are dimensioned to span the thickness of a circuit board 230 seen generally in FIGS. 8A, 8B, 8C, and 8D. In the illustrated implementation, through-board protrusions 145 are snap-fit members that include wings 165. When assembled, wings 165 extend outward from protrusions 145. Wings are inwardly flexible toward protrusions 145 during insertion through an appropriately-dimensioned opening in the circuit board 230 but return to an outwardly extended position as the board-facing surface of mount 125 approaches the circuit board 230 to form a robust mechanical coupling. In contrast to through-board protrusions 145, through-board protrusions 150 do not include wings. Protrusions 150 are dimensioned and positioned to pass through appropriately-dimensioned and positioned openings in the circuit board. Through-board protrusions 150 can thus ensure proper relative positioning of mount 125 on the circuit board and provide some measure of additional mechanical stability.

In other implementations, the mechanical coupling between mount 125 and the circuit board can be formed in other ways. For example, the number and arrangement of through-board protrusions can differ. As another example, other types of mechanical couplings (compression fittings, threaded fittings, solder or melt couplings, epoxy or other glues, or the like) can be used.

In the illustrated implementation, ferrite head housing 110 is a generally tubular member that is dimensioned to house a ring-shaped ferrite bead. In particular, ferrite bead housing 110 includes a base 175 and a lid 180 that—when they are coupled together—define a cavity dimensioned to receive a ferrite bead. In general, the cavity is vertically aligned with a site that forms the electrical connection between the wire and wire-to-board electrical connector 135. Although—aside from opening 120—base 175 and lid 180 are shown as generally solid structures, this is not necessarily the case. For example, base 175 and/or lid 180 can include one or more openings that expose ferrite bead 115. The ferrite bead housing 110 is generally made from a mechanically stable, non-conductive material.

In one example of construction, a circuit board could be provided with the mount 125 attached to the circuit board and surrounding the wire-to-board connector 135. A user could then slide one or more wires through the opening 120 of the housing 110 (which includes the ferrite bead, base 175 and lid 180) prior to attaching the one or more wires to the wire-to-board connector 135. Once the one or more wires are attached to the wire-to-board connector 135, the user can attach the base 175 of the housing 110 to the mount 125.

Figure 2A:
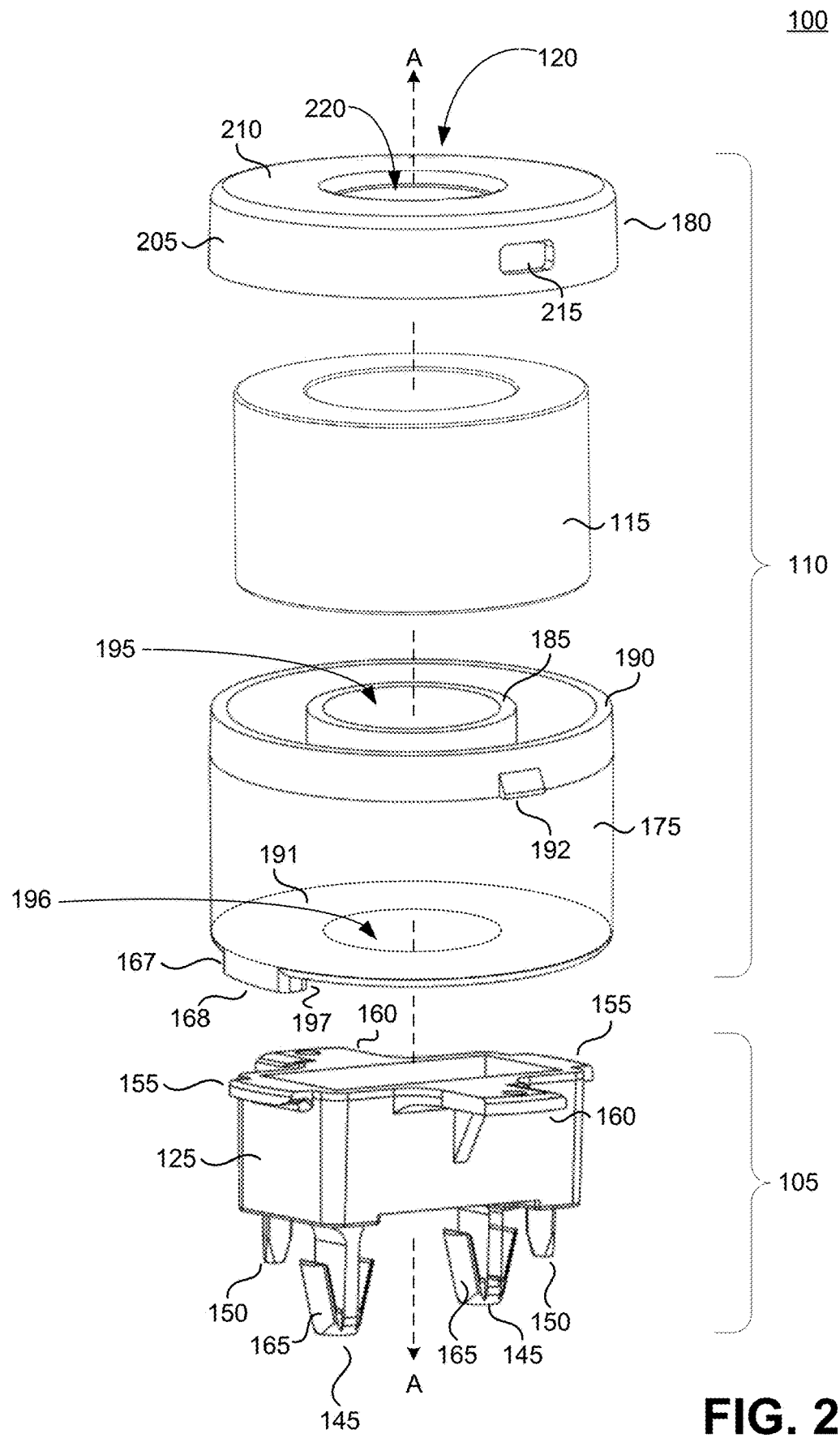

FIG. 2A illustrates an exploded view of the assembly 100 along an axis A, including the ferrite bead 115. As shown, the ferrite bead housing 110 is generally dimensioned to house ferrite bead 115 and includes base 175 and lid 180. In the illustrated implementation, base 175 includes an inner wall 185, an outer wall 190, and a floor 191. Floor 191 is outlined in a dotted line to illustrate that the floor 191 is generally hidden in a perspective view. Inner wall 185 is dimensioned to pass through the inside opening of a ring-shaped ferrite bead 115. Inner wall 185 also provides a first vertical opening 195 dimensioned to receive one or more wires that are electrically connected to wire-to-board connector 135. Inner wall 185 is also dimensioned to provide a second vertical opening 196 which is surrounded by floor 191. Outer wall 190 is dimensioned to surround the outside of the ferrite bead 115. In the illustrated implementation, outer wall 190 includes a number of protrusions 192 that are dimensioned and positioned to form a snap-fit connection with corresponding recesses 215 in lid 180. In other implementations, a mechanical coupling between base 175 and lid 180 can be formed in other ways. For example, the number and arrangement of protrusions and recesses can differ. As another example, other types of mechanical couplings (compression fittings, threaded fittings, solder or melt couplings, epoxy or other glues, or the like) can be used.

Figure 5:
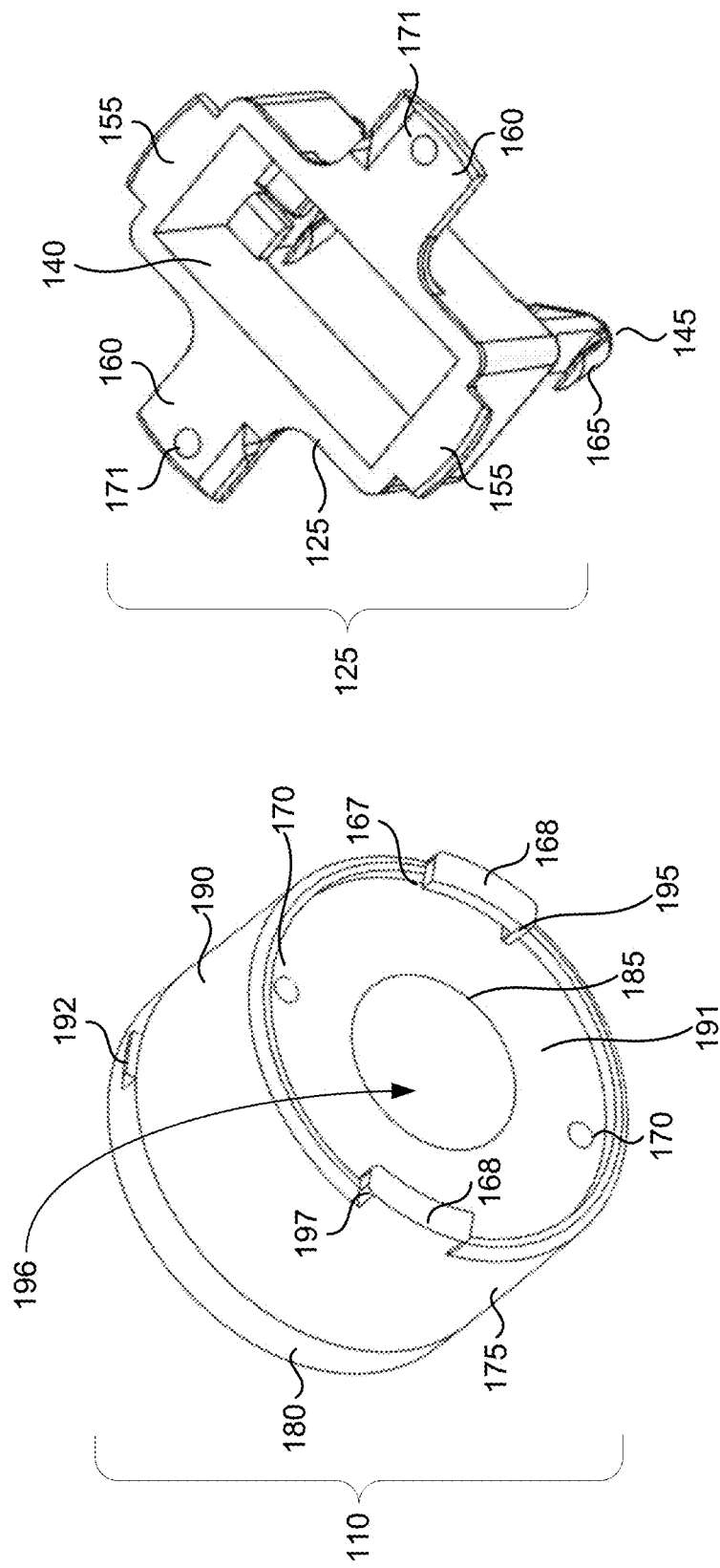

Floor 191 extends between inner wall 185 and outer wall 190 to support, from below a ring-shaped ferrite bead 115 that is received in base 175. The bottom surface of floor 191 includes a number of protrusions 168, which define slits 167, and protrusions 170. The protrusions 170 are not explicitly shown in FIG. 2A, but are illustrated in FIG. 5A. Further, slits 167 are also shown in FIGS. 4 and 5. Slits 167 and protrusions 170 are arranged generally symmetrically around a second vertical opening 196 to interact with corresponding mounting flanges 155, 160 on mount 125. As will be further discussed with respect to FIGS. 3B and 5, protrusions 168 are oriented such that slits 167 are laterally-oriented and extend radially inward toward the second vertical opening 196. Each protrusion 168 is configured and positioned to receive a tip portion of a corresponding laterally-oriented mounting flange 155 in the slit 167 defined by the protrusion 168. In particular, each mounting flange 155 can be positioned adjacent to a corresponding protrusion 168 and slit 167. Relative rotation between mount 125 and ferrite bead housing 110 can slide the tip portions of mounting flanges 155 into the respective slit 167. In the illustrated implementation, each protrusion 168 includes a wall 197 which defines the end of the slit 167 and that prevents the tip portions of mounting flanges 155 from exiting the other side of a corresponding slit 167. In the illustrated implementation, mount 125 and ferrite bead housing 110 are reversibly connected. In particular, relative rotation between mount 125 and ferrite bead housing 110 in the opposite direction can be performed to disconnect the ferrite bead housing 110 from the mount 125 without damage to either.

Lid 180 is dimensioned and configured to form—in conjunction with base 175—the generally cavity that houses the ferrite bead 115. In the illustrated implementation, the cavity that houses the ring-shaped ferrite bead 115 is also ring-shaped, albeit with larger dimensions that comfortably enclose the ferrite bead and limit relative movement between the ferrite bead and ferrite bead housing 110. In the illustrated implementation, lid 180 includes a vertical wall 205 and a horizontal ceiling 210. Ceiling 210 extends radially inward from vertical wall 205. Ceiling 210 defines a hole 220 that is positioned and dimensioned to align with first vertical opening 195 when lid 180 caps base 175. Hole 220 can receive the same one or more wires that pass through vertical opening 195 to connect with wire-to-board connector 135.

Vertical wall 205 is dimensioned to surround outer wall 190 of base 175. In the illustrated implementation, vertical wall 205 includes a number of recesses 215. Recesses 215 are dimensioned and positioned to form a snap-fit connection with corresponding protrusions 192 on outer wall 190 of base 175 as seen more clearly in FIGS. 4, 8A, 8B, 8C and 8D. Protrusions 192 are angled to aid the snap-fit connection of the lid 180 to base 175. In the illustrated implementation, recesses 215 are holes that extend through vertical wall 205, although this is not necessarily the case.

In other implementations, the mechanical coupling between lid 180 and base 175 can be formed in other ways. For example, the number and arrangement of recesses and protrusions can differ. As another example, other types of mechanical couplings (compression fittings, threaded fittings, solder or melt couplings, epoxy or other glues, or the like) can be used. Further, the lid 180 may be optional and the ferrite bead 115 may be secured within the base 175 by other means, such as glue.

Figure 2B:
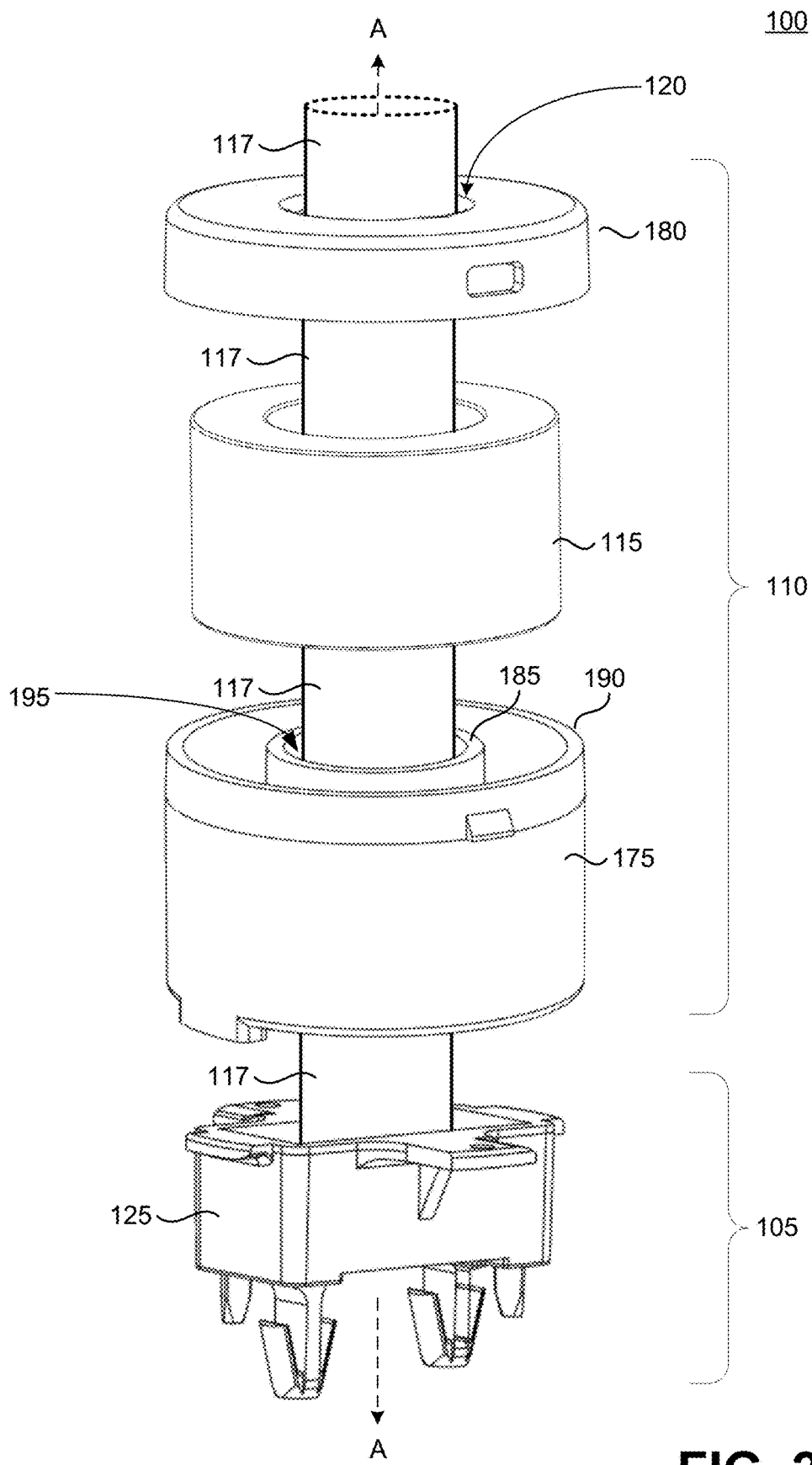

FIG. 2B also illustrates an exploded view of the assembly 100 along an axis A, including the ferrite bead 115 and wire 117 or cable. A cable can include two or more insulated wires in a single jacket. It should be appreciated that the exploded view shown in FIG. 2B is similar to the exploded view of assembly 100 shown in FIG. 2A. One difference, however, is the wire 117 or cable is shown inserted into the assembly 100. As shown, housing 110 defines an opening 120 through which one or more wires 117 (or cable) can pass to reach the electrical connector assembly 105.

Housing 110 includes the base 175 and lid 180. Also shown in FIG. 2B is the ferrite bead 115. Base 175 of housing 110 includes an inner wall 185 and an outer wall 190. The inner wall 185 is dimensioned to pass through the inside opening of a ring-shaped ferrite bead 115 and provides the first vertical opening 195, which is dimensioned to receive one or more wires 117 that are electrically connected to wire-to-board connector. The lid 180 also defines a hole, which defines the opening 120 of the housing 110, that is positioned and dimensioned to align with first vertical opening 195 when lid 180 caps base 175. The opening 110 can receive the same one or more wires 117 that pass through vertical opening 195.

In one example of construction, a circuit board could be provided with the mount 125 attached to the circuit board and surrounding the wire-to-board connector 135. A user could then slide one or more wires and/or cable 117 through the opening 120 of the housing 110 (which includes the ferrite bead, base 175 and lid 180) prior to attaching the one or more wires and/or cable 117 to the wire-to-board connector 135. Once the user attaches the one or more wires and/or cable 117 to the wire-to-board connector 135, the user can then attach the base 175 of housing 110 to the mount 125.

Figure 3A:
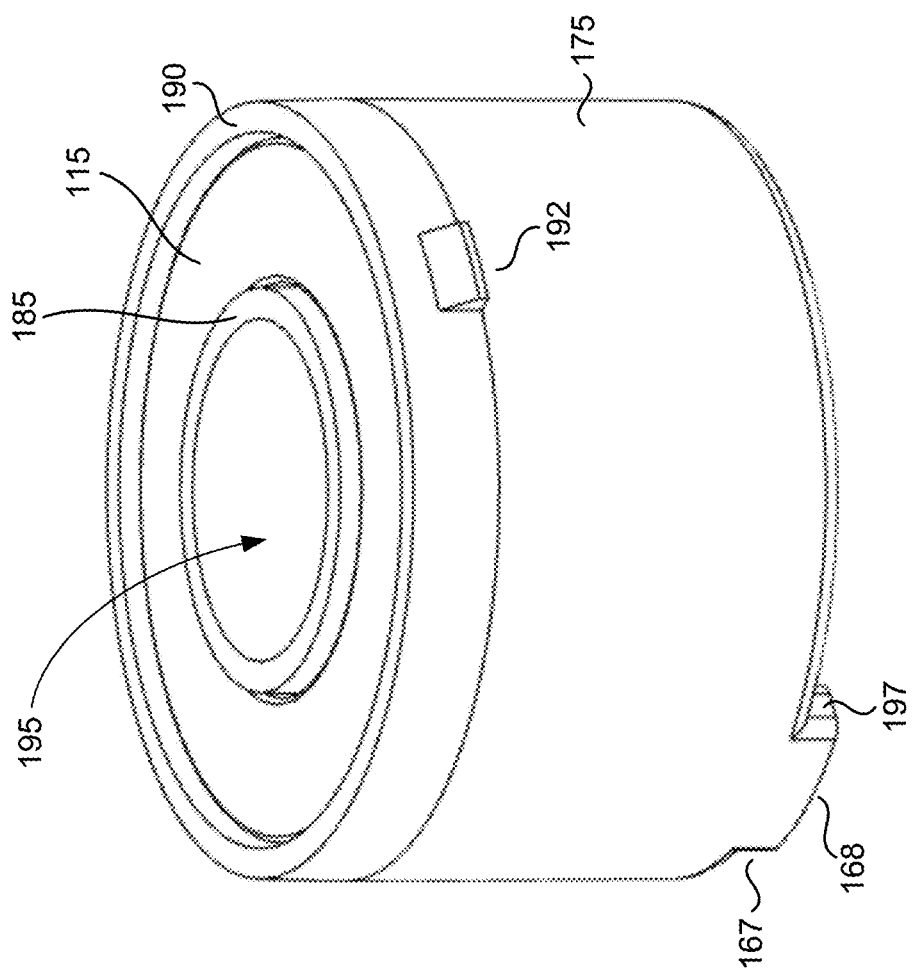

FIG. 3A illustrates a perspective view of the base 175 of the ferrite bead housing 110 with the ferrite bead 115 inserted into the base 175. It should be appreciated that the lid 180 is not shown to more clearly illustrate the ferrite bead 115 inserted into the base 175. Similar to as described above, the base 175 includes inner wall 185, outer wall 190, and a floor 191. It should be appreciated that in this view, the floor 191 is not visible. Inner wall 185 is dimensioned to pass through the inside opening of a ring-shaped ferrite bead 115. Inner wall 185 also provides the first vertical opening 195 dimensioned to receive one or more wires that are electrically connected to wire-to-board connector 135. Outer wall 190 is dimensioned to surround the outside of the ferrite bead 115. In the illustrated implementation, outer wall 190 includes a number of protrusions 192 that are dimensioned and positioned to form a snap-fit connection with corresponding recesses 215 in lid 180. Protrusions 192 are angled to aid the snap-fit connection of the lid 180 to base 175. The base 175 shown in FIG. 3A also illustrates protrusions 168 which define slits 167 which interact with corresponding mounting flanges 155 on mount 125. The protrusions 168 are oriented such that the slits 167 are laterally-oriented and extend radially inward toward the second vertical opening 196 (not shown). In the illustrated implementation, each protrusion 168 includes a wall 197 that defines the end of the slit 167 and prevents the tip portions of mounting flanges 155 from exiting the other side of a corresponding slit 167.

Figure 3B:
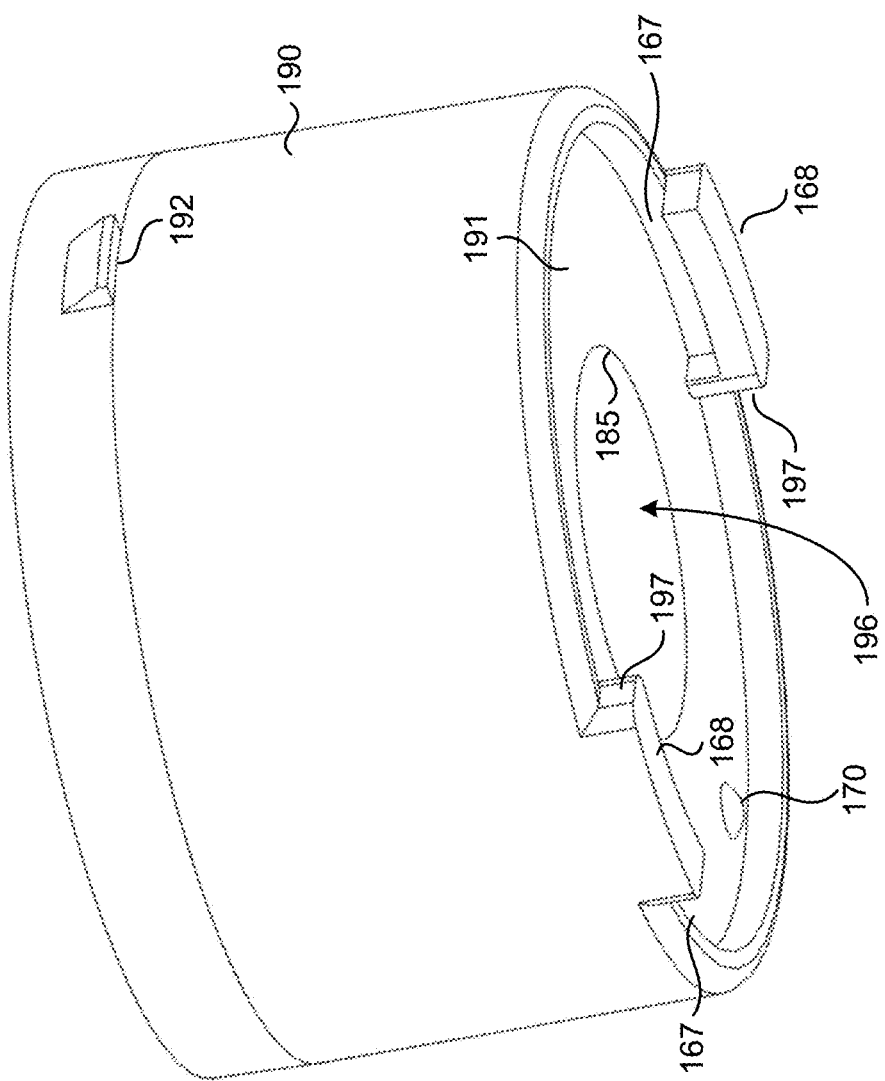

FIG. 3B illustrates a perspective view of the bottom of the base 175 to further illustrate the protrusions 170 and protrusions 168 which define slits 167. Similar to as described above, the base 175 includes inner wall 185, outer wall 190, and a floor 191. The inner wall 185 is dimensioned to provide the second vertical opening 196, which is surrounded by floor 191. The bottom surface of floor 191 includes a number of protrusions 168, which define slits 167. The bottom surface of floor 191 also includes protrusions 170. In the example shown, the protrusion 170 is generally circular, however the protrusion 170 could be oval, elliptical, or other shape. Protrusions 168, with slits 167, and protrusions 170 are arranged generally symmetrically around a second vertical opening 196 to interact with corresponding mounting flanges 155, 160 on mount 125. In particular, protrusions 168, with slits 167, interact with mounting flanges 155 while protrusions 170 interact with mounting flanges 160. Protrusions 168 are oriented such that slits 167 are laterally-oriented and extend radially inward toward the second vertical opening 196. In the illustrated implementation, each protrusion 168 includes a wall 197 which defines the end of the slit 167.

Each protrusion 168 is configured and positioned to receive a tip portion of a corresponding laterally-oriented mounting flange 155 of mount 125 in the slit 167 defined by the protrusion 168 and floor 191. In particular, each mounting flange 155 of mount 125 can be positioned adjacent to a corresponding protrusion 168 and slit 167 of housing 110. As is further illustrated with respect to FIG. 5, relative rotation between the mount 125 and ferrite bead housing 110 can slide the tip portions of mounting flanges 155 into the respective slit 167 of protrusion 168. In the illustrated implementation, each protrusion 168 includes a wall 197 that prevents the tip portions of mounting flanges 155 from exiting the other side of a corresponding slit 167.

FIG. 4 is a cross-section view of assembly 100 for mounting a ferrite bead or other filter component, including electrical connector assembly 105 and housing 110. Electrical connector assembly 105 forms a wire-to-board connection that fastens a wire, one or more wires, and/or a cable to a circuit board. Ferrite bead housing 110 is an assembly that is dimensioned to house a ferrite bead or other filter component 115. The ferrite bead housing 110 defines an opening 120 through which one or more wires can pass to reach the electrical connector assembly 105.

The electrical connector assembly 105 includes the mount 125. Mount 125 is a mechanical member that is configured to provide a relatively robust mechanical coupling between the ferrite bead housing 110 and the circuit board in the vicinity of a wire-to-board connector 135. As mentioned above, mount 125 is generally made from a mechanically stable, non-conductive material. Mount 125 acts an intermediary member between the ferrite bead housing 110 and a circuit board in the vicinity of wire-to-board connector 135. In general, mount 125 surrounds a wire-to-board connector 135 (as shown with respect to FIGS. 6A and 6B) and is connected to the circuit board at multiple locations radially distributed around wire-to-board connector 135.

As shown in FIG. 4, the mount 125 includes a receptacle 140 and through-board protrusions 145, 150. As will be further discussed, the mount 125 also includes mounting flanges. The receptacle 140 defines a volume or space that is dimensioned to receive at least a portion of the wire-to-board connector and is generally in the center of mount 125.

Protrusions 145, 150 are arranged generally symmetrically and radially around receptacle 140. However, it should be appreciated that this is not necessarily the case and. protrusions 145, 150 can also be arranged asymmetrically around receptacle 140. Protrusions 145, 150 extend vertically from the board-facing surface of mount 125 and are dimensioned to span the thickness of a circuit board. In the illustrated implementation, through-board protrusion 145 is a snap-fit member that includes wing 165. When assembled, wing 165 extends outward from protrusion 145. Wing 165 is inwardly flexible toward protrusion 145 during insertion through an appropriately-dimensioned opening in the circuit board but returns to an outwardly extended position as the board-facing surface of mount 125 approaches the circuit board to form a robust mechanical coupling.

In contrast to the through-board protrusion 145, through-board protrusion 150 does not include a wing. Protrusion 150 is dimensioned and positioned to pass through appropriately-dimensioned and positioned openings in the circuit board. Through-board protrusion 150 can thus ensure proper relative positioning of mount 125 on the circuit board and provide some measure of additional mechanical stability. Dotted line 152 represents the planar surface of a circuit board. As such, portions of through-board protrusion 145 and protrusion 145 extend past the planar surface 152 of the circuit board.

Ferrite bead housing 110 is dimensioned to house a ferrite bead. In particular, ferrite bead housing 110 includes base 175 and lid 180, which together define a cavity 141 dimensioned to receive a ferrite bead. In general, the cavity 141 is vertically aligned with a site that forms the electrical connection between the wire and wire-to-board electrical connector. Although—aside from opening 120—base 175 and lid 180 are shown as generally solid structures, this is not necessarily the case. For example, base 175 and/or lid 180 can include one or more openings that expose the ferrite bead. The ferrite bead housing 110 is generally made from a mechanically stable, non-conductive material.

As discussed above and further shown in FIG. 4, base 175 includes an inner wall 185, an outer wall 190, and a floor 191. Inner wall 185 is dimensioned to pass through the inside opening of a ring-shaped ferrite bead. Outer wall 190 is dimensioned to surround the outside of the ferrite bead. Floor 191 extends between inner wall 185 and outer wall 190 to support, from below, a ring-shaped ferrite bead that is received in base 175. As shown in FIG. 4, the bottom surface of floor 191 includes a number of slits 167. The bottom surface of floor 191 can also include protrusions, as is further shown in later figures. Slits 167 are arranged generally symmetrically around the second vertical opening 196. In particular, slits 167 are laterally-oriented and extend radially inward toward the vertical opening 195. As will be further shown, each slit 167 is configured and positioned to receive a tip portion of a corresponding mounting flange of the mount 125.

Lid 180 is dimensioned and configured to form—in conjunction with base 175—the general cavity 141 that houses the ferrite bead. In the illustrated implementation, lid 180 includes a vertical wall 205 and a horizontal ceiling 210. Ceiling 210 extends radially inward from vertical wall 205. Ceiling 210 defines a hole that is positioned and dimensioned to align with vertical opening 195 when lid 180 caps base 175. The hole of lid 180, along with vertical opening 195 forms the opening 120 of assembly 100.

FIG. 5 is a perspective view of the housing 110 and mount 125 of FIG. 1. In particular, the perspective view illustrates the bottom of the housing 110 and the top of the mount 125 to illustrate their respective aligning mechanisms.

The right hand side of FIG. 5 illustrates the mount 125. Mount 125 is a mechanical member that is configured to provide a relatively robust mechanical coupling between the ferrite bead housing 110 and the circuit board in the vicinity of wire-to-board connector 135. As shown, the mount 125 includes a receptacle 140, through-board protrusions 145, and a number of mounting flanges 155, 160. Receptacle 140 defines a volume or space that is dimensioned to receive at least a portion of wire-to-board connector 135. As illustrated, receptacle 140 is generally in the center of mount 125. Through-board protrusion 145 extends vertically from the board-facing surface of mount 125 and dimensioned to span the thickness of a circuit board. In the illustrated. implementation, through-board protrusions 145 are snap-fit members that include wings 165. Protrusions 145, 150 and mounting flanges 155, 160 are arranged generally symmetrically and radially around receptacle 140. However, this is not necessarily the case and protrusions 145. 150 and mounting flanges 155, 160 can also be arranged asymmetrically around receptacle 140. Indeed, asymmetrical arrangements may be preferred in applications where the directionality of likely mechanical disturbances is known. It should be appreciated that protrusions 150 are not visible in FIG. 5.

Mounting flanges 155, 160 are dimensioned to interact with corresponding member(s) on ferrite bead housing 110 and connect ferrite bead housing 110 to the mount 125. In the illustrated implementation, mounting flanges 155. 160 are distributed about receptacle 140 and extend laterally (i.e., in a direction generally parallel with the surface of the circuit board) from the vertical (i.e., in a direction generally perpendicular to the surface of the circuit board) walls of receptacle 140. Mounting flanges 155 are each dimensioned and positioned to be received in a corresponding slit 167 of protrusion 168 in the board-facing surface of the ferrite bead housing 110 when ferrite bead housing 110 is connected to mount 125. In the illustrated implementation, mounting flanges 160 each include a depression 171 that is dimensioned and positioned to receive a corresponding protrusion 170 in the board-facing surface of the ferrite bead housing 110. In the example shown, the depression 171 and the protrusion 170 are generally circular. However, it should be understood that the depression 171 and protrusion 170 could be oval, elliptical, or other shape. In other implementations, the board-facing surface of the ferrite bead housing 110 can include a depression and mounting flanges 160 can include a corresponding protrusion. In any case, mounting flanges 155, 160 interact with slits 167 of protrusion 168 and protrusion 170 to provide a relatively robust connection between ferrite bead housing 110 to the mount 125. As discussed further below, the connection is reversible and ferrite bead housing 110 can be separated from mount 125 without damage to either. In another example, the connection between the ferrite bead housing 110 and the mount 125 is not reversible.

In other implementations, the mechanical coupling between ferrite bead housing 110 and mount 125 can be formed in other ways. For example, the number and arrangement of flanges can differ. As another example, other types of mechanical couplings (compression fittings, threaded fittings, solder or melt couplings, epoxy or other glues, or the like) can be used.

As shown on the left hand side of FIG. 5, the housing 110 includes base 175 and lid 180. Base 175 includes inner wall 185, outer wall 190 and floor 191. Inner wall 185 provides the second vertical opening 196 dimensioned to receive one or more wires that are electrically connected to a wire-to-board connector. Outer wall 190 is dimensioned to surround the outside of the ferrite bead. In the illustrated implementation, outer wall 190 includes a number of protrusions 192 that are dimensioned and positioned to form a snap-fit connection with corresponding recesses in the lid 180.

Floor 191 extends between inner wall 185 and outer wall 190 to support, from below, a ring-shaped ferrite bead that is received in base 175. The bottom surface of floor 191 includes a number of slits 167 and protrusions 170. The protrusions 170 shown are generally circular, however oval, elliptical, or other shapes could be used. Slits 167 of protrusions 168 and protrusions 170 are arranged generally symmetrically around the second vertical opening 196 to interact with corresponding mounting flanges 155, 160 on mount 125. In particular, slits 167 are laterally-oriented and extend radially inward toward vertical opening 196. Each protrusion 168 is configured and positioned such that slit 167 receives a tip portion of a corresponding laterally-oriented mounting flange 155. In particular, each mounting flange 155 can be positioned adjacent to a corresponding protrusion 168 and slit 167. Relative rotation between mount 125 and ferrite bead housing 110 can slide the tip portions of mounting flanges 155 into the respective slit 167 of protrusion 168. In the illustrated implementation, each protrusion 168 includes a wall 197 that prevents the tip portions of mounting flanges 155 from exiting the other side of a corresponding slit 167. In the illustrated implementation, mount 125 and ferrite bead housing 110 are reversibly connected. In particular, relative rotation between mount 125 and ferrite bead housing 110 in the opposite direction can be performed to disconnect the ferrite bead housing 110 from the mount 125 without damage to either.

Protrusions 170 are vertically-oriented and extend from the hoard-facing surface of floor 191. Protrusions 170 are dimensioned and positioned to be received by a corresponding depression 171 in mounting flange 160 when mounting flanges 155 are received in their corresponding slits 167. Reception of protrusions 170 in the corresponding depression 171 in mounting flange 160 can reversibly maintain the relative rotational positioning of ferrite bead housing 110 and mount 125. Slits 167 and protrusions 170 thus interact with mounting flanges 155, 160 to provide a relatively robust connection between ferrite bead housing 110 and mount 125.

Figure 6A:
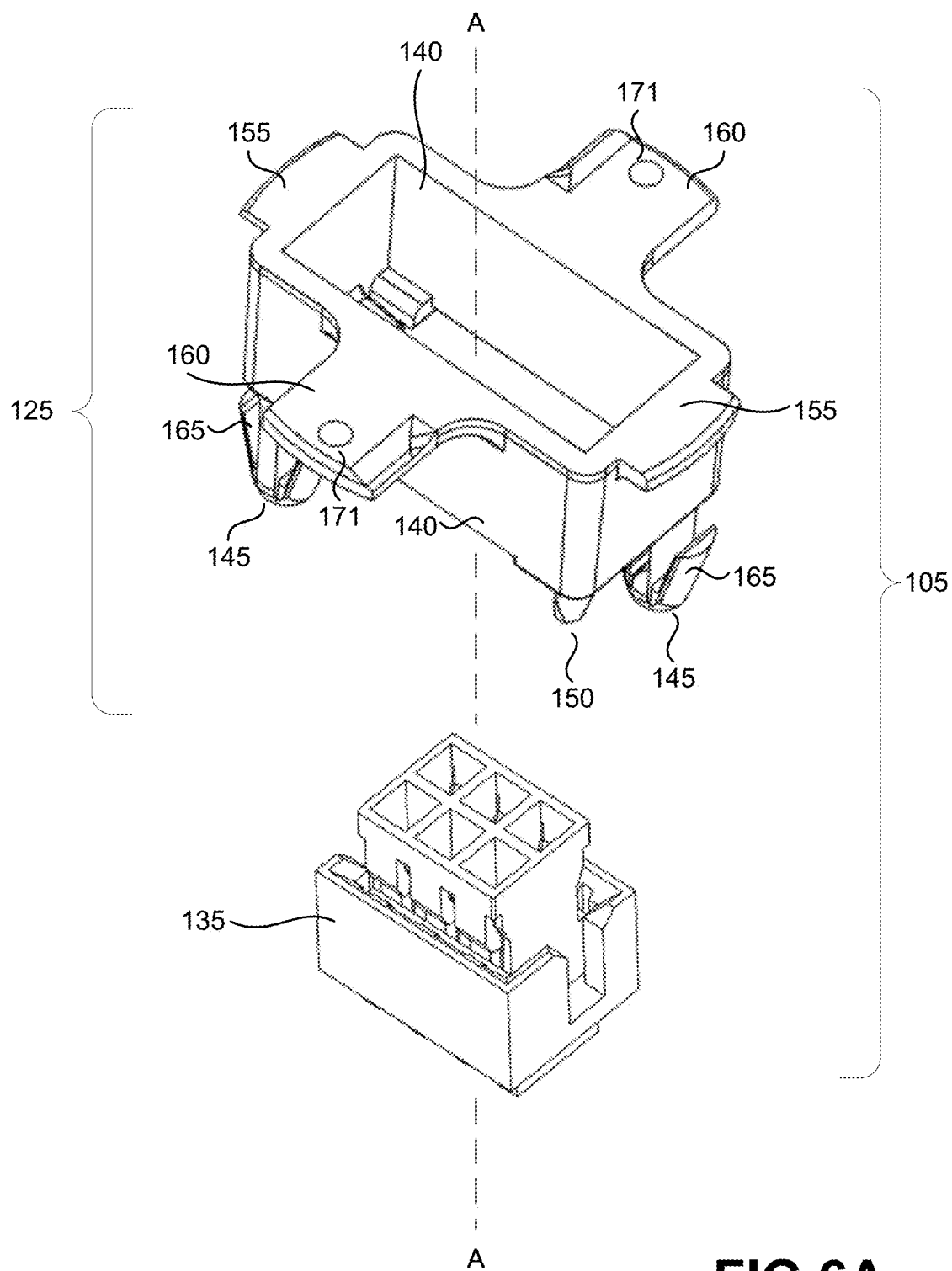
Figure 6B:
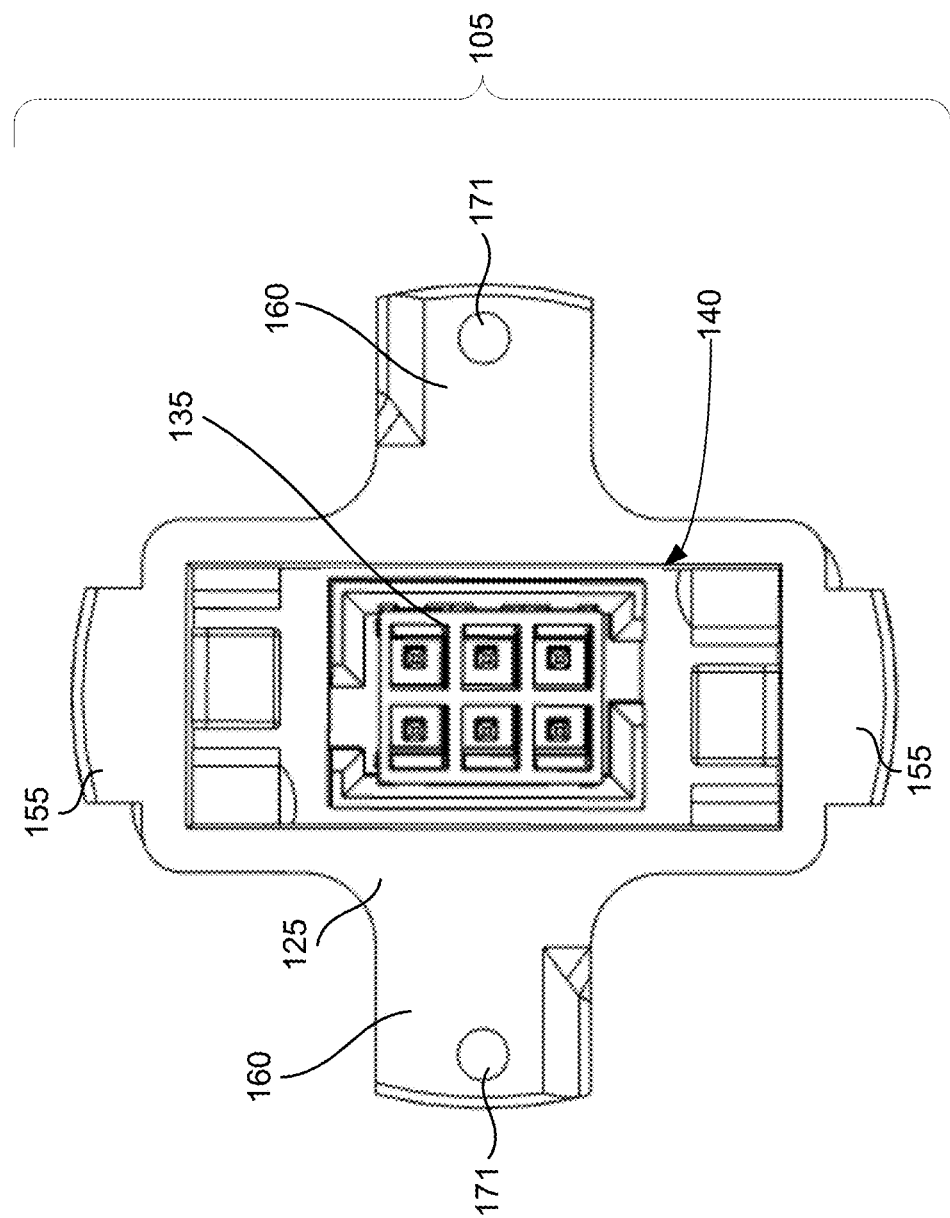

FIG. 6A illustrates an exploded view of an electrical connector assembly 105 including the mount 125 and a wire-to-board connector 135 while FIG. 6B illustrates a top view of the electrical connector assembly 105 with the mount 125 surrounding the wire-to-board connector 135.

In the illustrated implementation, electrical connector assembly 105 includes wire-to-board connector 135 and a mount 125. Wire-to-board connector 135 can be any of a number of different connectors that are suited for forming one or more electrical connections between conductor(s) of the circuit board and wire(s) that extend off the board. Wire-to-board connector 135 can use any of a variety of different technologies including, e.g., pin-and-socket, blade/contact, solder, or the like to form the electrical connection(s). Electrical terminals of the wire-to-board connector 135 can connect to the conductor(s) of the circuit board in either a thru-board or surface-mount arrangement.

In the implementation shown in FIGS. 6A and 6B, wire-to-board connector 135 is a dual-row plug. However, other types of electrical connections between conductor(s) of the circuit board and wire(s) can be used. For example, wires can be soldered to pads on circuit boards with a separate wire-to-board connector being present. As another example, a crimp connector can be used to connect a wire to a conductor of the circuit board.

As mentioned above, mount 125 is a mechanical member that is configured to provide a relatively robust mechanical coupling between the ferrite bead housing 110 and the circuit board in the vicinity of wire-to-board connector 135. Mount 125 is generally made from a mechanically stable, non-conductive material. Mount 125 acts an intermediary member between the ferrite bead housing 110 and the circuit board 230 in the vicinity of wire-to-board connector 135. In general, mount 125 surrounds wire-to-board connector 135 and is connected to the circuit board at multiple locations radially distributed around wire-to-board connector 135.

Mount 125 includes a receptacle 140, a number of through-board protrusions 145, 150, and a number of mounting flanges 155, 160. Receptacle 140 defines a volume or space that is dimensioned to receive at least a portion of wire-to-board connector 135. As illustrated, receptacle 140 is generally in the center of mount 125. As shown in FIG. 6B, the mount 125 substantially surrounds the wire-to-board connector 135. Protrusions 145, 150 and mounting flanges 155, 160 are arranged generally symmetrically and radially around receptacle 140. However, this is not necessarily the case and protrusions 145, 150 and mounting flanges 155, 160 can also be arranged asymmetrically around receptacle 140. Indeed, asymmetrical arrangements may be preferred in applications where the directionality of likely mechanical disturbances is known.

FIGS. 7A and 7B are perspective views which illustrate another embodiment of mount 125. The mount 125 shown in FIGS. 7A and 7B are similar to the mount 125 described above. For example, the mount 125 shown in FIGS. 7A and 7B include through-board protrusions 145, 150 which span the thickness of the circuit board. Further, through-board protrusions 145 are snap-fit members that include wings 165 while through-board protrusions 150 do not include wings. The mount 125 shown also includes receptacle 140 which defines a volume or space that is dimensioned to receive at least a portion of wire-to-board connector 135. At least one difference, however, is the mount 125 shown in FIGS. 7A and 7B includes a resting surface 235.

For example, the mount 125 shown in FIGS. 7A and 7B includes a resting surface 235 for the ferrite bead housing 110. The resting surface 235 is generally laterally oriented. Vertically protruding from the resting surface 235 are ridges 240, 245, and 250 which attach and position the ferrite bead housing 110 to the mount 125. FIGS. 8A, 8B, 8C, 8D illustrate a perspective view 800, top view 801, side view 802, and cross-section view 804 of the side view 802 of several assemblies 100, including the ferrite bead housing 110 and the electrical connector assembly 105, mounted onto a circuit board 230. The various views 800, 801, 802, and 804 illustrate two assemblies 100 mounted onto the circuit board 230 and surrounding two wire-to-board connectors 135. Further illustrated are wire-to-board connectors 135 which are not surrounded by the ferrite bead housing 110 or mount 125. The wire-to-board connectors 135 which are surrounded by assemblies 100 are shown on the left hand side of the circuit board 230 while the wire-to-board connectors 135 which are not surrounded by assemblies 100 are shown on the right hand side of the circuit board 230.

The perspective view 800 shown in FIG. 8A illustrates two assemblies 100 which surround wire-to-board connectors 135 on the left hand side of the circuit board 230. The assemblies 100 include the mounts 125 assembled onto the circuit board 230. Through-board protrusion 145 is shown in the perspective view 800. Respective bases 175 and lids are attached onto the mounts 125. Opening 120 is shown, which allows one or more wires to pass through the assembly and attach to the respective wire-to-board connector 135.

In one example of construction, the circuit board 230 could be provided with the mounts 125 attached to the circuit board 230 and surrounding the wire-to-board connectors 135. A user could then slide one or more wires through the opening 120 of the housing 110 (which includes the ferrite bead, base 175 and lid 180) prior to attaching the one or more wires to the wire-to-board connector 135. Once the one or more wires are attached to the wire-to-board connector 135, the user can attach the base 175 of the housing 110 to the respective mount 125.

Top view 801 shown in FIG. 8B illustrates how assemblies 100 surround wire-to-board connectors 135 and allows access for one or more wires to pass through the respective assembly 100 and attach to the respective wire-to-board connector 135. Wire-to-board connector 135 can be any of a number of different connectors that are suited for forming one or more electrical connections between conductor(s) of the circuit board and wire(s) that extend off the board. Wire-to-board connector 135 can use any of a variety of different technologies including, e.g., pin-and-socket, blade/contact, solder, or the like to form the electrical connection(s). Electrical terminals of the wire-to-board connector 135 can connect to the conductor(s) of the circuit board in either a thru-board or surface-mount arrangement. In the illustrated implementation, wire-to-board connector 135 is a dual-row plug. However, other types of electrical connections between conductor(s) of the circuit board and wire(s) can be used. For example, wires can be soldered to pads on circuit boards with a separate wire-to-board connector being present. As another example, a crimp connector can be used to connect a wire to a conductor of the circuit board.

Side view 802 shown in FIG. SC clearly illustrates the attachment of assembly 100 to the circuit board 230 with the through-board protrusions 145, 150. Through-board protrusions 145, 150 extend vertically from the board-facing surface of mount 125 and are dimensioned to span the thickness of circuit board 230. Through-board protrusions 145 are snap-fit members that include wings 165. When assembled, wings 165 extend outward from protrusions 145. Wings are inwardly flexible toward protrusions 145 during insertion through an appropriately-dimensioned opening in the circuit board 230 but return to an outwardly extended position as the board-facing surface of mount 125 approaches the circuit board 230 to form a robust mechanical coupling. In contrast to through-board protrusions 145, through-board protrusions 150 do not include wings. Protrusions 150 are dimensioned and positioned to pass through appropriately-dimensioned and positioned openings in the circuit board. Through-board protrusions 150 can thus ensure proper relative positioning of mount 125 on the circuit board and provide some measure of additional mechanical stability.

FIG. 8D illustrates a cross-section view 804 of the side view 802 shown in FIG. 8C. As shown, the mount 125 substantially surrounds the wire-to-board connector 135. The base 175 is illustrated as including inner wall 185, outer wall 190 and floor. Inner wall 185 is dimensioned to pass through the inside opening of a ring-shaped ferrite bead and provides a vertical opening a vertical opening to receive one or more wires that are electrically connected to wire-to-board connector 135. Outer wall 190 is dimensioned to surround the outside of the ferrite bead while floor 191 extends between the outer wall 190 and inner wall 185 to support the ferrite bead that is received in base 175. As shown in FIG. SD, the wire-to-board connector 135 partially extends in the vertical direction into the base 175 and the vertical opening defined by the inner wall 185. The lid 180 is shown as attached to the base 175 and includes vertical wall 205 and ceiling 210. Ceiling 210 extends radially inward from vertical wall 205.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

Although the present invention is defined in the claims, it should be understood that the present invention can alternatively be defined in accordance with the following examples:

Example 1

A device comprising: a circuit board; a filter component; a filter component housing configured to house the filter component, wherein the filter component housing is coupled to the circuit board; and at least one wire electrically connected to the circuit board and passing through the filter component.

Example 2

The device of example 1, further comprising a wire-to-board electrical connector coupled to the circuit board and electrically connecting the at least one wire to the circuit board.

Example 3

The device of example 1 or 2, wherein the filter component comprises a ferrite bead and the filter component housing is a ferrite bead housing.

Example 4

The device of example 1 or 3, wherein the filter component defines an opening that is aligned with a site that forms the electrical connection between the wire and wire-to-board electrical connector.

Example 5

The device of example 4, wherein the opening is axially aligned with the site that forms the electrical connection.

Example 6

The device of any one of examples 1 to 5, wherein: the filter component is generally ring-shaped; and the filter component housing defines a cavity dimensioned to receive the filter component.

Example 7

The device of any one of examples 1 to 6, wherein the filter component housing is coupled to the circuit board by a mount that surrounds the wire-to-board electrical connector.

Example 8

The device of example 7, wherein the mount is the mount of any one of examples 24 to 34.

Example 9

The device of any one of examples 1 to 8, wherein the circuit board is a part of a gate driver unit or a power converter.

Example 10

The device of any one of examples 1 to 8, further comprising a power converter controller coupled to the circuit board.

Example 11

The device of any one of examples 1 to 8, further comprising: a second filter component; a second filter component housing configured to house the second filter component, wherein the second filter component housing is coupled to the circuit board; a second wire-to-board electrical connector coupled to the circuit board; and a second wire electrically connected to the second wire-to-board electrical connector and passing through the second filter component.

Example 12

The device of example 1, wherein the filter component is one of a ferrite block, a core, a ring, an EMI filter, or a choke.

Example 13

A system for mounting a filter component to a circuit board, the system comprising: a filter component housing dimensioned to house a filter component; and a mount between the filter component housing and the circuit board, the mount configured to couple the filter component housing to the circuit board.

Example 14

The system of example 17, wherein the mount is connected to the filter component housing and to the circuit board.

Example 15

The system of any one of examples 13 to 14, wherein the mount comprises one or more through-board projections dimensioned to project through the circuit board and connect the mount thereto.

Example 16

The system of any one of examples 13 to 15, wherein the mount defines a receptacle dimensioned to receive a wire-to-board electrical connector, wherein reception of the wire-to-board electrical connector in the mount aligns one or more wires electrically connected to the circuit board by the connector with the filter component housed in the filter component housing.

Example 17

The system of any one of examples 13 to 16, wherein: the filter component and the filter component housing each defines a respective opening dimensioned to pass one or more wires; and wherein when the filter component is housed in the filter component housing, the respective openings are aligned.

Example 18

The system of any one of examples 13 to 17, wherein the filter component housing defines a generally-ring shaped cavity dimensioned to receive a generally ring-shaped filter component.

Example 19

The system of any one of examples 13 to 18, wherein the filter component housing is reversibly coupled to the mount.

Example 20

The system of any one of examples 13 to 19, wherein the filter component housing and the mount are connectable by relative rotation therebetween.

Example 21

The system of any one of examples 13 to 20, wherein: the filter component includes an opening configured to pass at least one wire there through; and the filter component housing is dimensioned to house the filter component with the opening oriented to receive a wire extending vertically from the circuit board.

Example 22

The system of any one of examples 13 to 20, wherein: the filter component is a ferrite bead; and the filter component housing is a ferrite bead housing.

Example 23

The system of any one of examples 13 to 22, wherein the mount is the mount of any one of examples 24 to 34.

Example 24

A mount configured to couple a filter component to a circuit board, wherein the mount defines a receptacle dimensioned to receive an electrical connection for connecting a wire to the circuit board, wherein reception of the electrical connection in the mount aligns one or more wires electrically connected to the circuit board by the connector when the filter component is housed in a filter component housing.

Example 25

The mount of example 24, wherein the electrical connection comprises a wire-to-board electrical connector.

Example 26

The mount of any one of examples 24 to 25, wherein the mount comprises a through-board projection dimensioned to extend through the circuit board.

Example 27

The mount of example 26, wherein the through-board projection is configured to form a snap-fit connection with the circuit board.

Example 28

The mount of any one of examples 26 to 27, wherein the through-board projection comprises an outwardly-extending wing configured to flex inwardly during insertion of the through-board projection through an appropriately-dimensioned opening in the circuit board but return to a outwardly-extending position as the board-facing surface of the mount approaches the circuit board.

Example 29

The mount of any one or examples 26 to 28, wherein the mount is configured to reversibly couple to the filter component housing.

Example 30

The mount of any one or examples 26 to 29, wherein the mount and the filter component housing are connectable by relative rotation therebetween.

Example 31

The mount of any one or examples 26 to 30, wherein the mount comprises two or more flanges arranged radially about the receptacle.

Example 32

The mount of example 31, wherein the flanges extend laterally outward away from the receptacle.

Example 33

The mount of any one of examples 31 to 32, wherein at least a portion of the flanges is positioned and dimensioned to be received in a corresponding portion of the filter component housing.

Example 34

The mount of one any one of examples 31 to 33, wherein the flanges define a depression positioned and dimensioned to receive a corresponding portion of the filter component housing.

Example 35

The mount of any one of examples 31 to 34, wherein: the filter component is a ferrite bead; and the filter component housing is a ferrite bead housing.

Example 36

The mount of example 24, where the filter component is one of a ferrite block, a core, a ring, an EMI filter, or a choke.

What is claimed is:

1. A device comprising:
   a circuit board;
   a filter component;
   a filter component housing configured to house the filter component, wherein the filter component housing comprises:
      a base; and
      a lid coupled to the base, wherein the base and lid define a cavity dimensioned to receive the filter component;
   at least one wire electrically connected to the circuit board and passing through the filter component;
   a wire-to-board electrical connector coupled to the circuit board and electrically connecting the at least one wire to the circuit board, wherein the at least one wire is electrically connected to the wire-to-board electrical connector; and
   a mount configured to couple the filter component housing to the circuit board, wherein the mount substantially surrounds the wire-to-board electrical connector and the filter component housing is reversibly coupled to the mount.

2. The device of claim 1, wherein the filter component comprises a ferrite bead and the filter component housing is a ferrite bead housing.

3. The device of claim 1, wherein the filter component defines an opening that is aligned with a site that forms the electrical connection between the at least one wire and wire-to-board electrical connector.

4. The device of claim 3, wherein the opening is axially aligned with the site that forms the electrical connection.

5. The device of claim 4, wherein:
   the filter component is generally ring-shaped.

6. The device of claim 1, wherein the mount defines a receptacle dimensioned to receive at least a portion of the wire-to-board electrical connector, wherein reception of at least the portion of the wire-to-board electrical connector in the mount aligns the at least one wire electrically connected to the circuit board when the filter component is housed in the filter component housing.

7. The device of claim 6, wherein the mount comprises a through-board projection dimensioned to extend through the circuit board.

8. The device of claim 7, wherein the through-board projection is configured to form a snap-fit connection with the circuit board.

9. The device of claim 7, wherein the through-board projection comprises an outwardly-extending wing configured to flex inwardly during insertion of the through-board projection through an appropriately-dimensioned opening in the circuit board but return to an outwardly-extending position as the board-facing surface of the mount approaches the circuit board.

10. The device of claim 6, further comprising:
a second filter component;
a second filter component housing configured to house the second filter component, wherein the second filter component housing is coupled to the circuit board;
a second wire-to-board electrical connector coupled to the circuit board; and
a second wire electrically connected to the second wire-to-board electrical connector and passing through the second filter component.

11. The device of claim 1, wherein the filter component is one of a ferrite block, a core, a ring, an EMI filter, or a choke.

12. The device of claim 1, wherein the circuit board is a part of a gate driver unit or a power converter.

13. The device of claim 1, further comprising a power converter controller coupled to the circuit board.

14. A system for mounting a filter component to a circuit board, the system comprising:
a filter component housing dimensioned to house the filter component, the filter component housing comprises:
a lid; and
a base coupled to the lid, wherein the lid and the base define a cavity dimensioned to house the filter component; and
a mount between the filter component housing and the circuit board, the mount configured to couple the filter component housing to the circuit board, wherein the mount includes a receptacle dimensioned to receive a wire-to-board electrical connector configured to electrically connect to a wire and the filter component housing is reversibly coupled to the mount.

15. The system of claim 14, wherein the mount is connected to the filter component housing and to the circuit board.

16. The system of claim 14, wherein reception of the wire-to-board electrical connector in the mount aligns one or more wires electrically connected to the circuit board by the connector with the filter component housed in the filter component housing.

17. The system of claim 16, wherein the mount comprises one or more through-board projections dimensioned to project through the circuit board and connect the mount thereto.

18. The system of claim 17, wherein the one or more through-board projections are configured to form a snap-fit connection with the circuit board.

19. The system of claim 17, wherein the one or more through-board projections comprise an outwardly-extending wing configured to flex inwardly during insertion of the through-board projection through an appropriately-dimensioned opening in the circuit board but return to an outwardly-extending position as the board-facing surface of the mount approaches the circuit board.

20. The system of claim 14, wherein:
the filter component and the filter component housing each define a respective opening dimensioned to pass one or more wires; and
wherein when the filter component is housed in the filter component housing, the respective openings are aligned.

21. The system of claim 14, wherein the filter component housing defines a generally-ring shaped cavity dimensioned to receive a generally ring-shaped filter component.

22. The system of claim 14, wherein:
the filter component includes an opening configured to pass at least one wire therethrough; and
the filter component housing is dimensioned to house the filter component with the opening oriented to receive a wire extending vertically from the circuit board.

23. The system of claim 14, wherein:
the filter component is a ferrite bead; and
the filter component housing is a ferrite bead housing.

24. The system of claim 14, wherein the filter component is one of a ferrite block, a core, a ring, an EMI filter, or a choke.

* * * * *